United States Patent

Scheffold

[11] Patent Number: 6,118,345
[45] Date of Patent: Sep. 12, 2000

[54] PROCESS AND DEVICE FOR LOCKING-IN A YIG-TUNED OSCILLATOR

[75] Inventor: Bruno Scheffold, Leutkirch, Germany

[73] Assignee: Daimler-Benz Aerospace AG, Munich, Germany

[21] Appl. No.: 09/202,826

[22] PCT Filed: Apr. 9, 1998

[86] PCT No.: PCT/EP98/02102

§ 371 Date: Mar. 23, 1999

§ 102(e) Date: Mar. 23, 1999

[87] PCT Pub. No.: WO98/48513

PCT Pub. Date: Oct. 29, 1998

[30] Foreign Application Priority Data

Apr. 22, 1997 [DE] Germany ............................ 197 16 776

[51] Int. Cl.[7] .......................... H03L 7/087; H03L 7/099; H03L 7/113; H03L 7/16
[52] U.S. Cl. ................................ 331/11; 331/14; 331/16; 331/18; 331/17; 331/25; 331/DIG. 2; 327/156; 455/260
[58] Field of Search ........................... 331/2, 4–7, 10–12, 331/14, 16–18, 25, DIG. 2; 327/156–159; 455/260

[56] References Cited

U.S. PATENT DOCUMENTS

| | | | |
|---|---|---|---|
| 4,459,560 | 7/1984 | Kurihara | 331/2 |
| 4,728,906 | 3/1988 | Turl et al. | 331/4 |
| 4,792,768 | 12/1988 | Fried et al. | 331/11 |
| 4,890,071 | 12/1989 | Curtis | 331/11 |
| 5,130,670 | 7/1992 | Jaffe | 331/2 |

FOREIGN PATENT DOCUMENTS 2290184 12/1995 United Kingdom .

OTHER PUBLICATIONS

"High–Spectral–Purity Frequency Synthesis in a Microwave Signal Generator" by J. Summers et al. Oct. 1989. pp. 37–41, *Hewlet–Packard Journal* vol. 40, No. 5.

*Primary Examiner*—David Mis
*Attorney, Agent, or Firm*—Venable; Norman N. Kunitz

[57] ABSTRACT

The object of the invention is to provide a lock-in process and device for a YIG-tuned oscillator which takes into account ageing and hysteresis of the YIG-tuned oscillator. This object is attained in that during a predetermined frequency change, the frequency of the YIG-tuned oscillator (1) is preset by means of a microprocessor (17) that progressively changes the current ($I_{SP}$) in the main tuning coil (13) of the YIG-tuned oscillator (1) by an iterative capture routine, until the capture range ($\Delta FM$) of the switched-on frequency-locked loop, which changes with the coil current ($I_{SP}$), includes the new operating frequency ($f_{SET}$). The switched-on frequency-locked loop then pulls the oscillator frequency into the capture range of the PLL and the PLL locks-in the oscillator frequency to the new operating frequency ($f_{SET}$). The microprocessor (17) interrupts the capture routine when a PLL-LOCK detector (11) announces to the microprocessor (17) that the new operating frequency ($f_{SET}$) has been successfully locked-in. The invention is used in a process for locking-in a phase-locked loop (PLL) to a YIG-tuned oscillator whose frequency is brought into the PLL capture range by a frequency-locked loop equipped with a frequency discriminator. When the PLL is locked-in, the frequency-locked loop can be switched off.

15 Claims, 5 Drawing Sheets

PROCESS AND DEVICE FOR LOCKING-IN A YIG-TUNED OSCILLATOR

BACKGROUND OF THE INVENTION

The invention relates to a method of locking in a phase-locked loop (PLL) around a YIG-tuned oscillator whose frequency is guided into the PLL capture range by a frequency-control loop provided with a frequency discriminator, with the frequency-control loop being able to be switched off after the PLL has locked in; The invention additionally relates to an arrangement for executing the method.

YIG-tuned oscillators are used to suppress the phase jitter near a platform, usually by means of a PLL coupled to a quartz oscillator that is frequency stable in the long term. When a change occurs in the frequency, the small capture range of the relatively narrow-bandwidth PLL is problematic with respect to locking into a new operating frequency.

It is known (Floyd M. Gardner, Phaselock Techniques, Wiley & Sons, New York, 1979, pp. 84–87) to support the lock-in of the PLL with an additional frequency-control loop. In the frequency-control loop, a frequency discriminator is used to determine the control deviation. As soon as the frequency of the YIG-tuned oscillator is guided into the PLL capture range by means of the frequency-control loop, the YIG-tuned oscillator is almost exclusively controlled by the frequency-control loop. If desired, the frequency-control loop can then be shut off (Gardner; see above). YIG-tuned oscillators can be subject to aging, and have a hysteresis, which has a negative effect on the precision of the control of the oscillator frequency via the primary-coil current of the YIG-tuned oscillator. This control is necessary when a change occurs in the frequency for returning the oscillator frequency to the capture range of the control loops.

It is an object of the invention to provide a lock-in method for a YIG-tuned oscillator that takes into consideration aging and hysteresis of the YIG-tuned oscillator. It is a further object of the invention to provide an arrangement for executing the method.

SUMMARY OF THE INVENTION

In accordance with the invention, the above objects are accomplished according to a first aspect of the invention by a method of locking in a phase-locked loop (PLL) around a YIG-tuned oscillator whose frequency is guided into the PLL capture range by a frequency-control loop provided with a frequency discriminator, with the frequency-control loop being able to be switched off after the PLL has locked in, and wherein: with a predetermined change in frequency, the frequency of the YIG-tuned oscillator is preset by a microprocessor that changes the coil current ($I_{SP}$) of the primary tuning coil of the YIG-tuned oscillator stepwise in an iterative capture routine until the capture range ($\Delta FM$) of the switched-on frequency-control loop, which is shifted with the coil current ($I_{SP}$), includes the new operating frequency ($f_{SOLL}$), whereupon the switched-on frequency-control loop pulls the oscillator frequency into the PLL capture range, and the PLL locks into the new operating frequency ($f_{SOLL}$); and the microprocessor interrupts the capture routine if the PLL-LOCK detector announces to the microprocessor that the new operating frequency ($f_{SOLL}$) has been locked in.

The above objects are achieved according to a second aspect of the invention by an arrangement for carrying out the method according to the invention, wherein: a predeterminable portion of the output signal of the YIG-tuned oscillator is compared to a reference frequency by a coupling-out stage in a frequency discriminator; the output signal ($\Delta f$) of the frequency discriminator is supplied into the negative-feedback branch of a loop filter as an integrator, whose output current is used directly as a coil current ($I_{FM}$) for regulating the magnetic field of the FM coil of the YIG-tuned oscillator; the coil current ($I_{SP}$) of the primary tuning coil of the YIG-tuned oscillator is generated by a V/I converter, which is controlled by a microprocessor via a D/A converter; the output signal ($\Delta f$) of the frequency discriminator is detected by a PLL-LOCK detector, that transmits its output signal ($U_D$) to the microprocessor; and, an in-phase signal (sin) is coupled from a phase comparator of the frequency discriminator, and is supplied to the input of the loop filter.

Modifications are disclosed in the dependent claims.

In a known manner, the invention uses a frequency-control loop to assist in locking in the relatively narrow-bandwidth PLL. To overcome the imprecisions in the presetting of the YIG-tuned oscillator to the frequency-control-loop capture range, which imprecisions can be traced back to the aging and hysteresis of the YIG-tuned oscillator, a capture routine that affects the current of the primary tuning coil of the YIG-tuned oscillator, and takes into account these imprecisions, is additionally initiated by means of a microprocessor when a frequency change occurs.

The solutions of the invention, in conjunction with the frequency-control loop and the PLL, permit a reliable, fast locking of the actual frequency into a new operating frequency. The dependent claims disclose advantageous capture routines for an alternative coupling of the YIG-tuned oscillator to one or two quartz oscillators. It is further disclosed how the invention can advantageously be used to compensate a drift of the YIG-tuned oscillator locked into an operating frequency. An advantageous modification of the if invention relates to the storage of the aging-based offset for faster execution of subsequent lock-in processes.

The invention can be applied to a YIG-tuned oscillator that is used as a low-jitter microwave-signal source, and covers a large frequency-tuning range, e.g. the entire X band, with two quartz oscillators that are frequency stable over the long term. In the PLL, one of the quartz oscillators acts on a settable frequency multiplier and, with f1, selects the desired frequency segment of the preparation from the relatively-wide tuning range of the YIG-tuned oscillator; the other quartz oscillator determines the output frequency f2 within this segment using a Direct Digital Synthesizer (DDS). In this circuit, the YIG-tuned oscillator oscillates at the output at the combination frequency $f_{YIG}=n*f1+f2$.

BRIEF DESCRIPTION OF THE DRAWINGS

Embodiments of the invention are explained below in conjunction with the drawings.

DETAILED DESCRIPTION OF A PREFERRED EMBODIMENT

Figure 1:
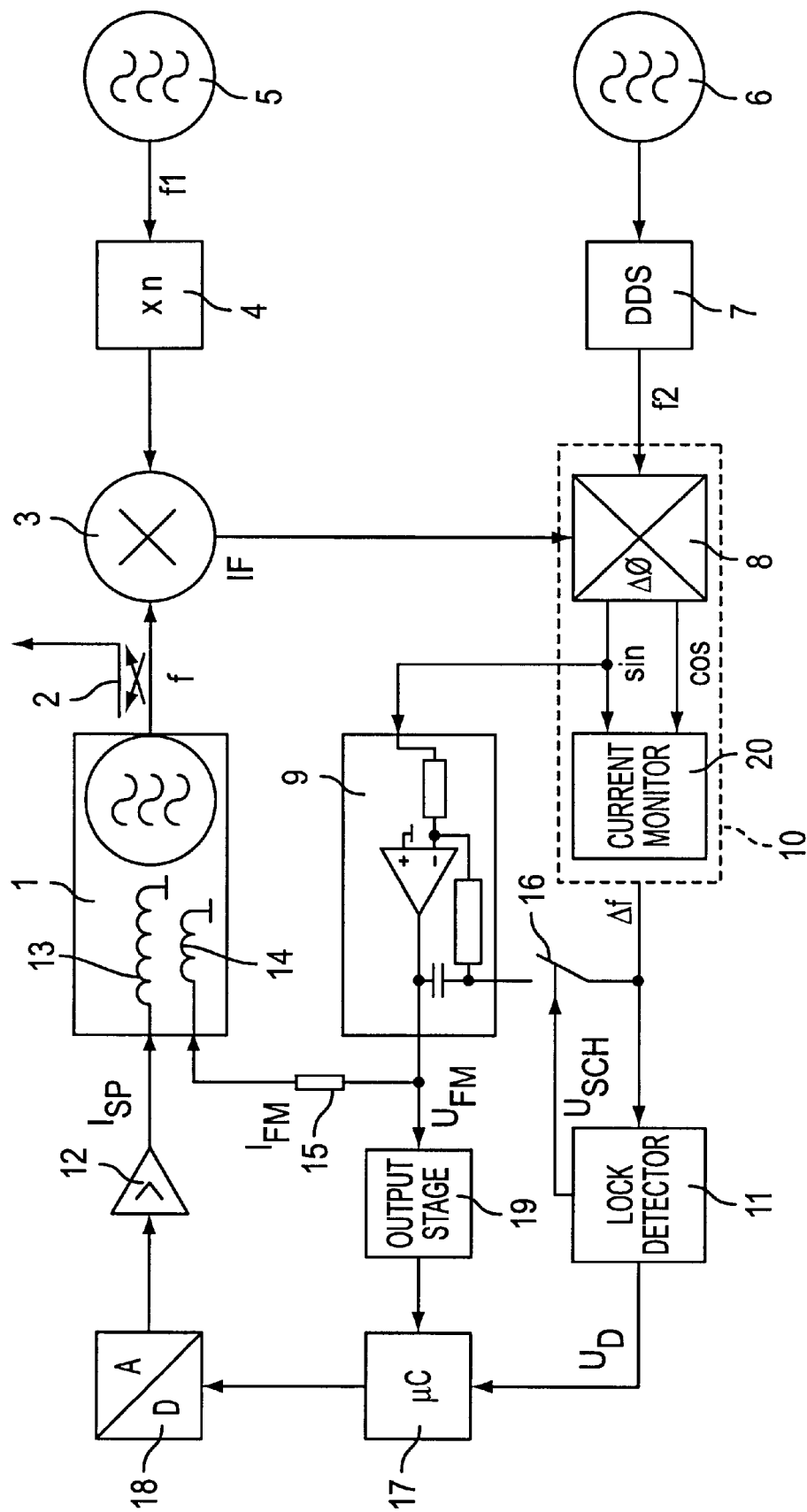
FIG. 1 shows an arrangement for executing the lock-in method of the invention, in which the YIG-tuned oscillator is coupled to two quartz oscillators.

The arrangement shown in FIG. 1 comprises the YIG-tuned oscillator 1 having a primary tuning coil 13 and an FM coil 14, a coupling-out stage 2, a frequency mixer 3, a frequency multiplier 4, two quartz oscillators 5 and 6, a direct digital synthesizer 7, a frequency discriminator 10 having a phase comparator 8 and an output stage 20, a loop filter 9, an ohmic resistor 15, a PLL-LOCK detector 11, an FM-coil current monitor 19, an analog switch 16, a microprocessor 17, a D/A convertor 18 and a V/I converter 12.

The YIG-tuned oscillator 1 utilizes two inputs for determining frequency. The entire oscillation range of the YIG-tuned oscillator can be tuned with the primary tuning coil 13; in addition, the FM coil 14 permits a fine-tuning of the oscillator frequency.

For the purpose of suppressing the phase jitter near the platform, the YIG-tuned oscillator 1 is coupled to the two quartz oscillators 5 and 6 that are frequency stable over the long term. In this instance, the output signal of the YIG-tuned oscillator 1 is supplied as an actual value to the frequency mixer 3 after a coupling of the output signal as a useful signal has occurred in the coupling-out stage 2. The quartz oscillator 5 supplies the nominal value f1, which, after multiplication by a predeterminable factor n in the frequency multiplier 4, is likewise supplied to the frequency mixer 3 and, with the actual value, forms the beat-frequency signal IF at the output of the frequency mixer 3. The output signal of the frequency mixer 3 is supplied to the phase comparator 8 of the frequency discriminator 10, and compared there to the output frequency (f2) of the direct digital synthesizer (DDS) 7, which is fed by the second quartz oscillator 6. The output frequency of the DDS can be predetermined externally.

In the frequency discriminator 10, the input-side phase comparator 8 is split in a known manner (Gardner; see above) into two quadrature components, with the in-phase detector simultaneously serving as a phase comparator for the PLL. To this end, the in-phase component sin is coupled out of the frequency discriminator 10 following the phase detection, and supplied to the input of the loop filter 9.

The detected quadrature components sin and cos are multiplied together in the output stage 20 of the frequency discriminator 10 following a filtering and a differentiation of one of the two components, and the signal product forms the output signal $\Delta f$ of the frequency discriminator 10. Up to a negligible ripple, this output signal $\Delta f$ is essentially a DC-voltage signal whose level is proportional to the difference between the frequencies fed into the phase comparator 8. The signal is supplied to the input of a PLL-LOCK detector 11 and fed parallel to this, via an analog switch 16, into the negative-feedback branch of the loop filter 9 embodied with a low-jitter operation amplifier as an integrator. The analog switch 16 can be controlled from the PLL-LOCK detector 11 with a control signal $U_{SCH}$.

The loop filter 9 emits the output voltage $U_{FM}$. This output voltage is fed, as a coil current $I^{FM}$ and converted via an ohmic resistor 15, directly into the FM coil 14 of the YIG-tuned oscillator 1 and supplied in parallel to an FM-coil current monitor 19.

The primary tuning coil 13 of the YIG-tuned oscillator 1 is supplied with a coil current $I_{SP}$ by a controllable V/I converter 12. The V/I converter 12 is controlled by the microprocessor 17 by way of a D/A converter 18.

The microprocessor 17 evaluates the output signal $U_D$ of the PLL-LOCK detector 11 and the output signal of the FM-coil current monitor 19.

For a change in frequency, the frequency signals emitted by the quartz oscillators 5, 6 are set at the new operating frequency $f_{SOLL}$ by means of the frequency multiplier 4 or the direct digital synthesizer 7. Because the new operating frequency $f_{SOLL}$ usually lies outside of the PLL capture range, the loop loses lock. The occurring output signal $\Delta\Phi$ of the phase comparator 8 leads to a zero deviation of the output signal $\Delta f$ of the frequency discriminator 10, with the PLL-LOCK detector 11 emitting a control signal $U_{SCH}$ to close the analog switch 16.

The microprocessor 17 then starts a capture routine, with which the middle frequency $f_0$ of the YIG-tuned oscillator 1 and the associated capture range $\Delta FM$ of the frequency-control loop are purposefully shifted until the new operating frequency $f_{SOLL}$ falls within the capture range $\Delta FM$. The oscillator middle frequency $f_0$ is the output frequency of the YIG-tuned oscillator 1, and is set as a function of the set coil current $I_{SP}$ in the primary tuning coil 13, and with a currentless FM coil 14 ($I_{FM}=0$) under the influence of aging and hysteresis. The capture range $\Delta FM$ of the frequency-control loop lies symmetrically around this oscillator middle frequency $f_0$, and is limited by the maximum possible coil current $I^{FM}$ in the FM coil 14, which is in turn established by the finite voltage range—$U_{max} < U_{FM} < +U_{max}$ at the output of the loop filter 9. Because the frequency-control loop has lost lock prior to and at the beginning of the capture routine, the output voltage $U_{FM}$ of the loop filter 9 is at the positive or negative voltage limit of the loop filter 9 switched as an integrator. Consequently, with an impressed coil current $I_{SP}$, no unambiguous actual frequency f is set initially; instead, the actual frequency f can occur either at the upper or lower limit of the capture range $\Delta FM$ centered on the intended oscillator middle frequency $f_0$. If, over the course of the capture routine, the new operating frequency $f_{SOLL}$ falls within the capture range $\Delta FM$ shifted with the coil current $I_{SP}$, the frequency-control loop pulls the actual frequency f of the YIG-tuned oscillator 1 to the new operating frequency $f_{SOLL}$.

Figure 2:
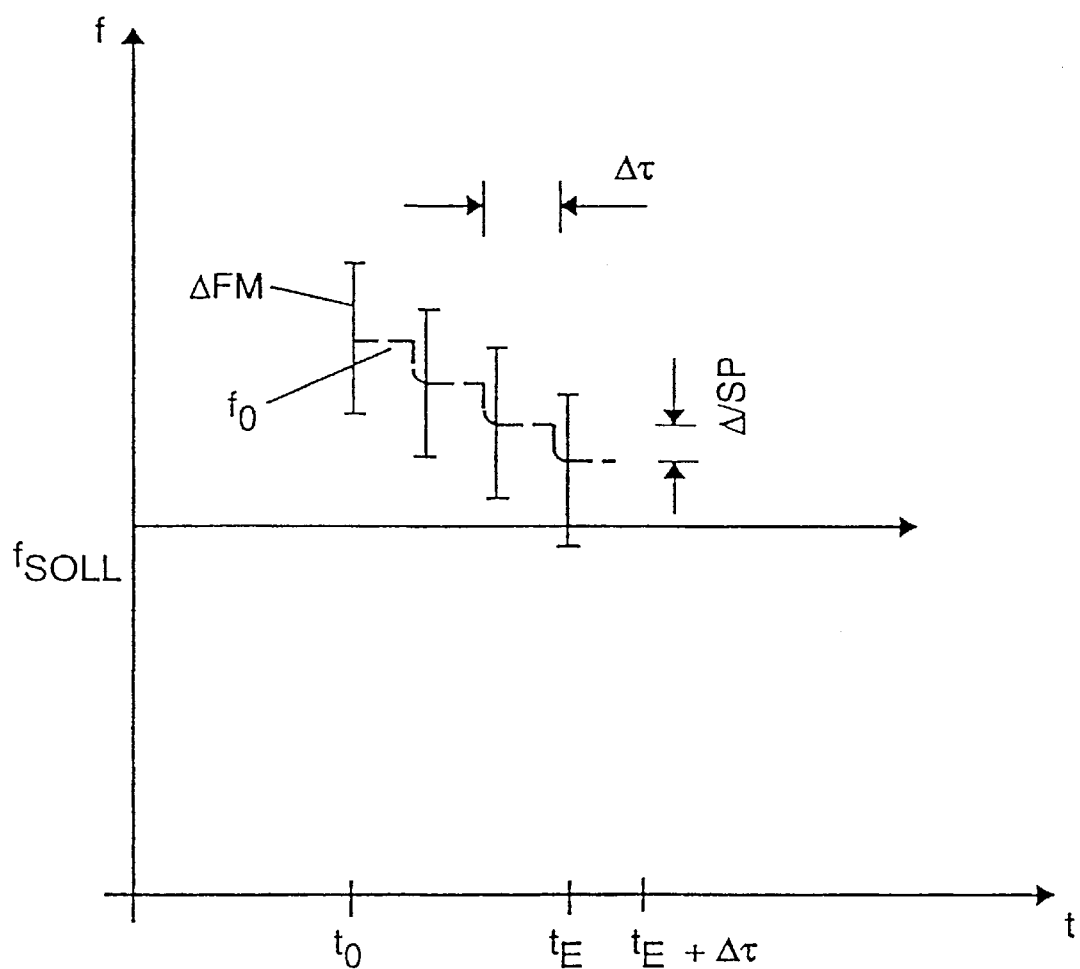
FIG. 2 shows the course of a lock-in method according to the invention that deliberately starts above the new operating frequency $f_{SOLL}$.

FIG. 2 shows the course over time of a capture routine. Here the capture routine involves a successive reduction of the oscillator middle frequency $f_0$ of the YIG-tuned oscillator 1, controlled by the microprocessor 17, which impresses the coil current $I_{SP}$ via the D/A converter 18 and the downstream V/I converter 12 of the primary tuning coil 13.

The capture routine starts at the time $t_0$ with an actual frequency f, which reliably lies above the new operating frequency $f_{SOLL}$, with consideration of the maximum characteristic deviation that, based on experience, can be assumed for a certain YIG-tuned oscillator type as a consequence of aging and hysteresis. The undefined state of the actual frequency f in the individual iteration steps is indicated for each iteration step by an I-shaped capture range $\Delta FM$, with the actual frequency f being located at the upper or lower limit. The intended oscillator middle frequency $f_0$ is shown as a dashed line in FIG. 2. The size of the coil-current steps $\Delta ISP$ relative to the capture range $\Delta FM$, and the clock duration $\Delta\tau$ of the capture routine, are shown in the illustrated oscillator middle frequency $f_0$. From a starting value, the microprocessor 17 reduces the coil current $I_{SP}$ by constant, adjacent coil-current steps that result in frequency steps ΔISP until the output signal $U_D$ of the PLL-LOCK detector 11, the signal being monitored by the microprocessor 17, assumes the "HIGH" signal state. For this purpose, a capture range ΔFM of the frequency-control loop, the range being relocated with the coil current $I_{SP}$, must include the new operating frequency $f_{SOLL}$—in FIG. 2, this time is represented by $t_E$—and the actual frequency f is pulled into the PLL capture range by the switched-on frequency-control loop within the clock duration Δτ, and pulled to the new operating frequency $f_{SOLL}$ by the PLL. In accordance with the invention, the coil-current steps are embodied such that the effected frequency steps ΔISP at the output of the YIG-tuned oscillator 1 are smaller than the capture range ΔFM of the frequency-control loop.

For a commercially-available YIG-tuned oscillator, the above-described capture routine can be started in the X band with a coil current $I_{ISP}$, which effects an oscillator middle frequency $f_0$, which lies about 40 MHz above the new operating frequency $f_{SOLL}$, according to the characteristic of the YIG-tuned oscillator 1. This frequency value will not be set, however, because the actual frequency is influenced by aging and hysteresis, and therefore deviates from the characteristic. In a frequency-control-loop capture range ΔFM of 4 MHz, as is typical in an X band, a value that leads to a frequency step ΔISP of 3.5 MHz is suited for the coil-current step, which is smaller according to the invention. From the upper starting value, a frequency range below this can therefore be covered without gaps. The clock duration Δτ of the capture routine can be about 10 ms. The aforementioned values are only given as examples, and can be randomly adapted by one skilled in the art to the respective circumstances without requiring inventive step.

Figure 3:
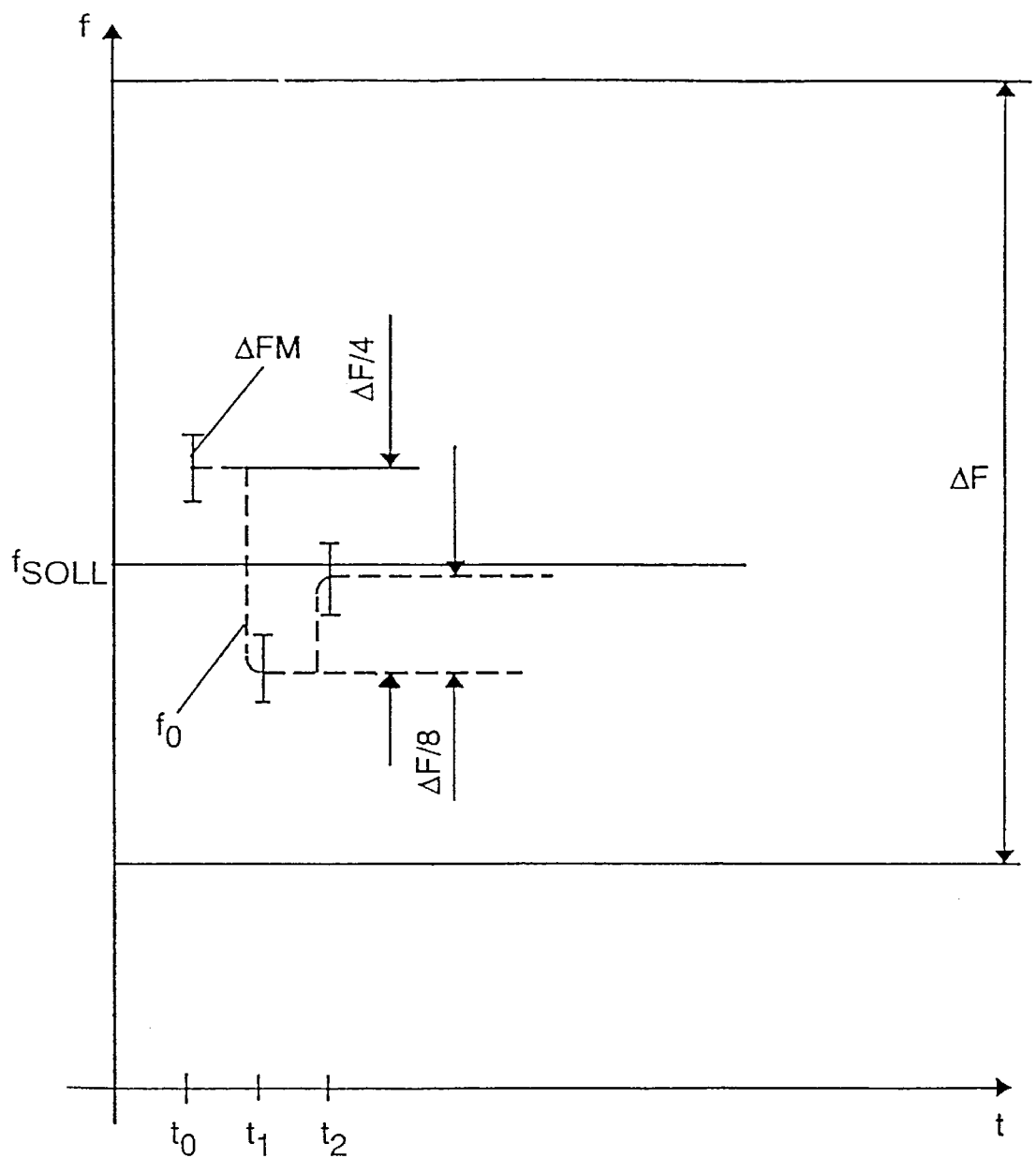
FIG. 3 shows the course of a lock-in method of the invention, in which the capture routine starts with a coil current ($I_{SP}$), which is associated with the new operating frequency $f_{SOLL}$ according to the type-specific characteristic of the YIG-tuned oscillator.

FIG. 3 shows a different embodiment of a capture routine according to the invention. In this capture routine, unlike in the above-described capture routine, varying coil-current steps are used. The step width is halved from iteration step to iteration step, and the adjustment direction of the coil-current steps is a function of the operational sign of the frequency deviation remaining in the previous iteration step. To determine this operational sign, the output signal Δf of the frequency discriminator 10 that contains this information is evaluated.

The capture routine starts at the time to with a coil current $I_{SP}$, which, according to the characteristic of the YIG-tuned oscillator 1, leads to an oscillator middle frequency $f_0$, which corresponds to the new operating frequency $f_{SOLL}$. As a consequence of aging and hysteresis, this frequency will not be set. For describing the capture routine, it is assumed here that an actual frequency is set above the new operating frequency $f_{SOLL}$. A negative frequency deviation is equally likely to occur, however. As described above for a frequency-control loop that has lost lock, the actual frequency is not defined, and will be set within the capture range ΔFM, specifically at the upper or lower limit of this range. The setting range of actual frequencies in the individual iteration steps is illustrated in an I shape. The iteration step at the time $t_1$ is initiated with a coil-current step whose value is ¼ of the coil-current difference, which corresponds to an assumed lock-in range ΔF lying symmetrically around the initially-set oscillator middle frequency $f_0$. The size of this lock-in range ΔF is established such that the new operating frequency $f_{SOLL}$ is invariably within this lock-in range ΔF for a certain YIG-tuned oscillator type if an actual frequency f having the value of the new operating frequency $f_{SOLL}$ is set in the first iteration step.

The coil-current step at the time $t_1$ will be performed with a reversed, here a negative, operational sign because of the positive frequency deviation assumed above by way of example. The microprocessor 17 obtains the information for the selection of the operational sign from the PLL-LOCK detector 11. For use in this capture routine, the PLL-LOCK detector 11 is equipped with two binary, complementary signal outputs, one of which assumes the "HIGH" signal state with a positive output signal ΔF of the frequency discriminator 10, while the other assumes this state with a negative output signal. For the output signal ΔF=0, the outputs are no longer complementary; in this instance, both outputs switch to the "LOW" signal state.

If, after the execution of the preceding coil-current step, a frequency deviation still exists, which is assumed to be the case in FIG. 3, the next coil-current step is performed at the time $t_2$ with one-half the step width of the preceding step. Its value is ⅛ of the current-coil difference, which corresponds to the lock-in range ΔF. This step has a positive operational sign, because a negative frequency deviation remains in the preceding iteration step. In the execution of this coil-current step, it should be assumed that the capture range ΔFM of the frequency-control loop includes the new operating frequency $f_{SOLL}$. The frequency-control loop switched on by way of the analog switch 16 at the start of the capture routine pulls the actual frequency f into the capture range of the PLL, which in turn pulls the actual frequency f to the new operating frequency $f_{SOLL}$. If the capture range ΔFM still does not include the new operating frequency $f_{SOLL}$ at the time $t_2$, the capture routine is continued with a further halving of the coil-current steps and the reversal of the operational sign, which is dependent on the output signal. The above-described capture routine has the advantage that the actual frequency f is brought very quickly, in only a few iteration steps, to the new operating frequency $f_{SOLL}$, so the control loops lock in.

For operating a YIG-tuned oscillator in the X band, a value of 20 MHz can be assumed for a possible lock-in range ΔF. This value is dependent on the respective component type of the YIG-tuned oscillator.

If the actual frequency f has been pulled to the new operating frequency $f_{SOLL}$, the PLL-LOCK detector 11 generates a switching signal $U_{SCH}$, with which the analog switch 16 is opened. The frequency-control loop is thus separated, because the output signal ΔF of the frequency discriminator 10 no longer enters the negative-feedback branch of the loop filter 9. This switch-off function is optional, not absolutely necessary, because when the actual frequency f enters the capture range of the PLL, the PLL dominates over the frequency-control loop because of its significantly-higher DC amplification. The advantage of switching off the frequency-control loop is that the PLL is not disturbed by the jitter of the frequency-control loop.

The most significant effect of aging of the YIG-tuned oscillator 1 is a zero shift of the linear connection between the coil current $I_{SP}$ and the actual frequency f. The slope of this characteristic remains unaffected by this shift. This aspect of aging permits the microprocessor to determine the offset of the actual frequency f, as dictated by aging, when the PLL is in the locked-in state, and store and take into consideration this offset in a required frequency change for subsequent capture routines. A subsequent capture routine need only take into account the hysteresis error, and therefore operates considerably faster.

Figure 4:
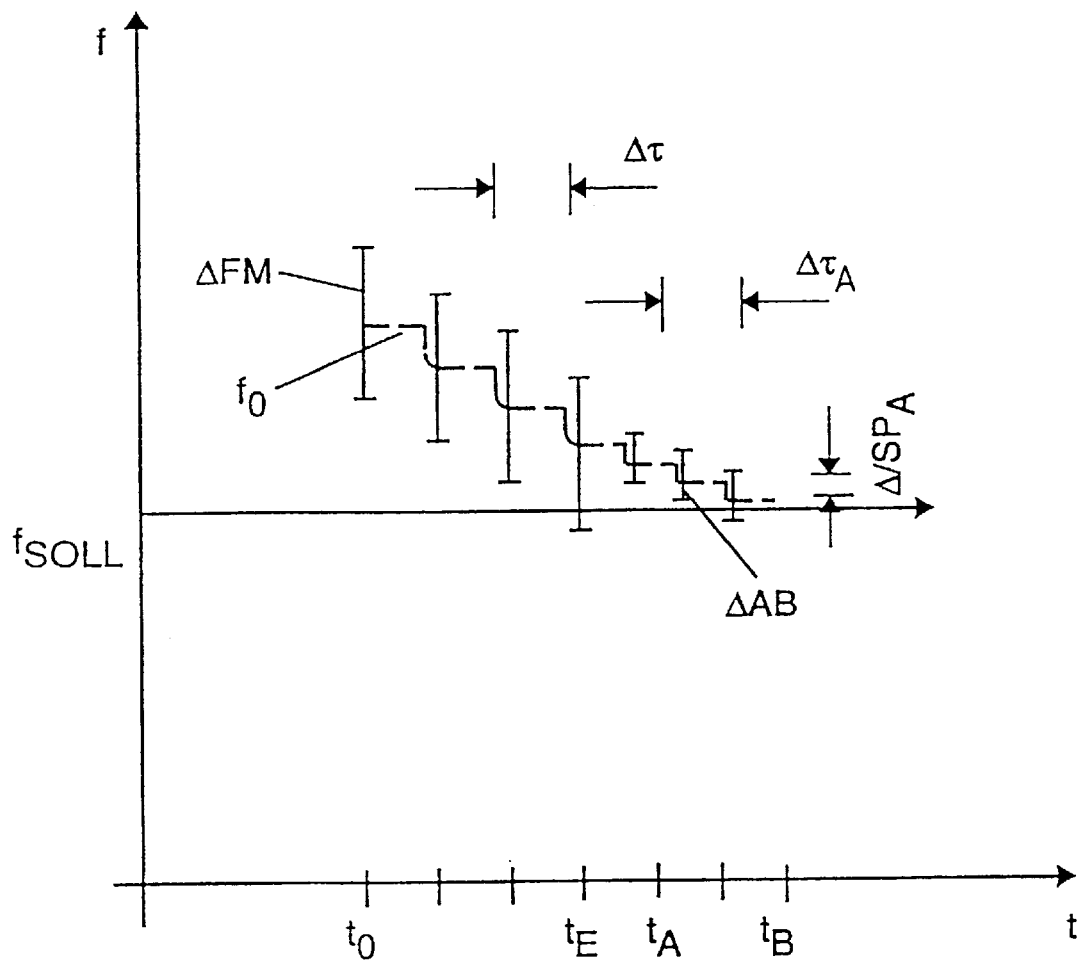
FIG. 4 shows the course of a lock-in method of the invention, with an additional tuning routine for the FM coil.

FIG. 4 shows how an optional tuning routine operates following one of the above-described capture routines. This tuning routine is also a step-wise adjustment of the coil current $I_{SP}$ of the primary tuning coil 13, controlled by the microprocessor 17, with the objective of bringing the coil current $I_{FM}$ of the FM coil 14 into a working range that is preferred for the operation amplifier of the loop filter 9. In FIG. 4, the preferred current-working range is shown with the corresponding frequency range as the working-frequency range ΔAB. In this routine, the coil current $I_{SP}$ is adjusted as a function of the output signals of the FM-coil current monitor 19, which detects the coil current $I_{FM}$ at the output of the loop filter 9.

The FM-coil current monitor 19, as a window discriminator, is equipped with two binary signal outputs, one of which assumes the "HIGH" signal state if the coil current $I_{FM}$ exceeds an upper threshold value $+I_{MAX}$, while the other output enters this signal state if a lower threshold value $-I_{MAX}$ is exceeded. If the coil current $I_{FM}$ is in the window between $+I_{MAX}$ and $-I_{MAX}$, both signal outputs assume the "LOW" signal state. In the illustrated example, in the tuning routine, the coil current $I_{SP}$ is adjusted with coil-current steps whose frequency steps $\Delta ISP_A$ are smaller than the frequency steps ΔISP in the preceding capture routine. A smaller clock duration $\Delta\tau_A$ is likewise selected for the tuning routine. The tuning routine of the invention can, however, also be performed with other coil-current steps and clock durations.

The tuning routine starts at the time $t_A$ following the last iteration step of the capture routine. When it is detected that the coil currents $I_{FM} > +I_{MAX}$, coil-current steps are performed with a negative operational sign, that is, the oscillator middle frequency $f_0$ is reduced, and when it is detected that the coil currents $I_{FM} < -I_{MAX}$, the coil current $I_{SP}$ is adjusted in the opposite direction. If both signal outputs of the FM-coil current monitor 19 are in the "LOW" state, the microprocessor 17 ends the tuning routine. In FIG. 4, the time $t_B$ is assumed for this.

In the operation of the YIG-tuned oscillator 1 locked into the new operating frequency $f_{SOLL}$, the effect of the PLL can be impaired by an excessive coil current $I_{FM}$ due to a drift of the YIG-tuned oscillator, the loop compensating the drift with the current. To keep the coil current $I_{FM}$ in the working range of the loop filter 9, the microprocessor 17 optionally initiates a drift routine, which is embodied with the same means as described above: an FM-coil current monitor 19 as a window discriminator with the threshold values $+I_{MAX}$ and $-I_{MAX}$, frequency steps $\Delta ISP_A$, a clock duration $\Delta\tau$, and a reversal of the operational sign for the frequency steps when the coil currents $I_{FM}$ are too large or too small. The PLL remains in phase, because frequency steps initiated by the microprocessor 17 do not start abruptly, but with a specific time constant in the ms range. The use of this drift routine is optional, and depends on the anticipated drift of the used YIG-tuned oscillator type and the type of loop filter.

Figure 5:
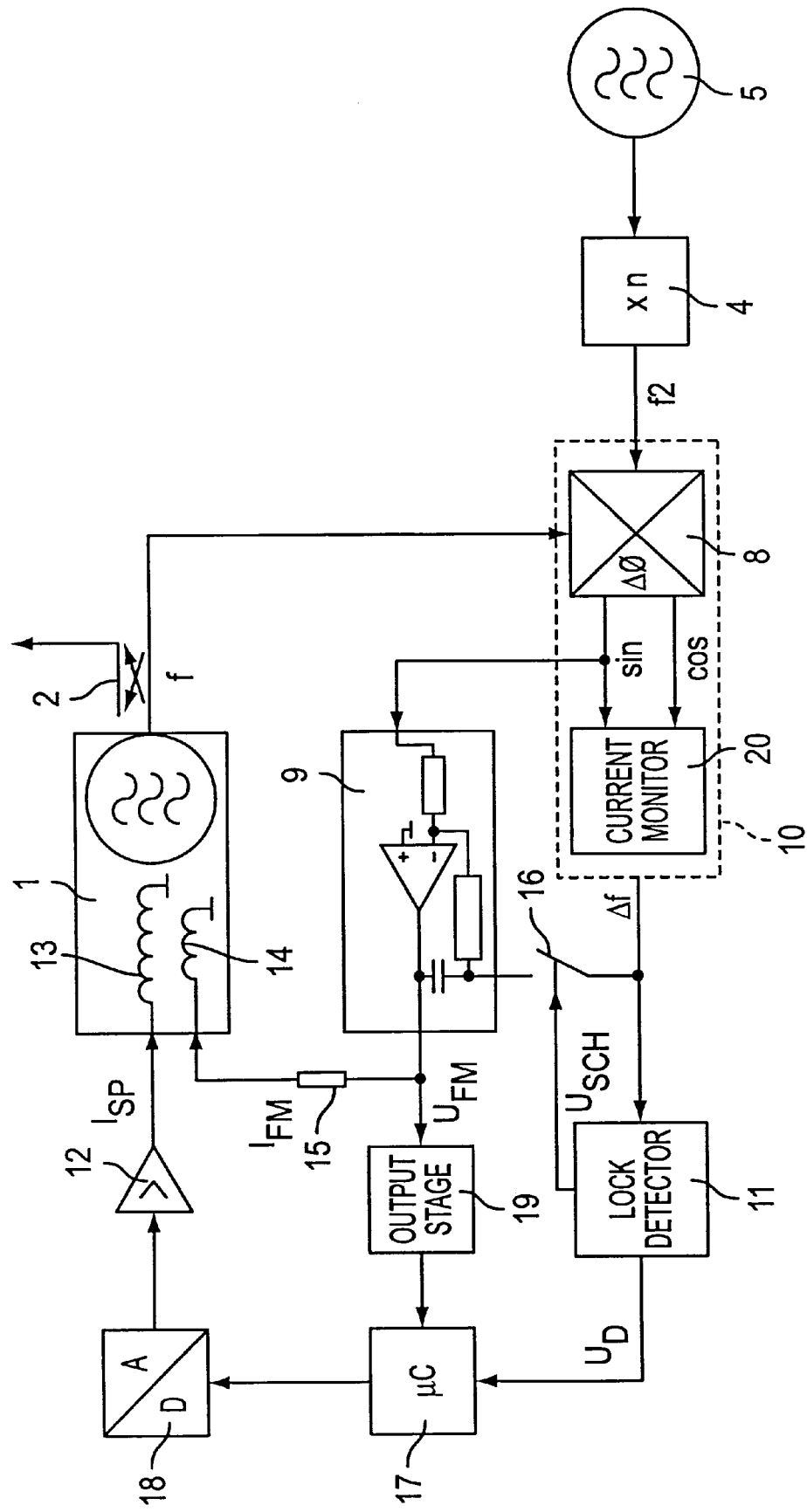
FIG. 5 shows an arrangement for executing the methods of the invention, in which the YIG-tuned oscillator is only coupled to one quartz oscillator.

FIG. 5 shows an arrangement for executing the method of the invention, in which the YIG-tuned oscillator 1 is only coupled to one quartz oscillator 5, as compared to the arrangement shown in FIG. 1. Otherwise, this arrangement corresponds to the arrangement shown in FIG. 1 and the associated description. In addition to the second quartz oscillator 6, the frequency mixer 3 is also omitted in this arrangement, because the output signal of the YIG-tuned oscillator 1 is supplied, as the actual frequency f, directly to the phase comparator 8 of the frequency discriminator 10 after passing through the coupling-out phase 2. The DDS 7 is also omitted in addition to the quartz oscillator 6.

In this arrangement, unlike in the arrangement described in FIG. 1, only one operating frequency $f_{SOLL}$ exists. In the arrangement according to FIG. 1, two sidebands, which lead to the two new operating frequencies $f_{SOLL} = n^*f1 +/- f2$, are formed at the output of the frequency mixer 3.

The arrangement according to FIG. 5, having only one new operating frequency, has the advantage that the capture routine according to FIG. 3, in which the coil current $I_{SP}$ starts at the new operating frequency $f_{SOLL}$, can also be used without difficulties. In the arrangement having two new operating frequencies $f_{SOLL}$, the actual frequency f can lock into an incorrect new operating frequency $f_{SOLL}$ in the capture routine according to FIG. 3 if the lock-in range ΔF must be selected to be too large because of the consideration of aging and hysteresis. In this case, the capture routine according to FIG. 2 would have to be used, which ensures that the actual frequency f definitively locks into the upper, new operating frequency $f_{SOLL} = n^*f1 + f2$.

What is claimed is:

1. A method of locking in a phase-locked loop (PLL) around a YIG-tuned oscillator whose frequency is guided into the PLL capture range by means of a frequency-control loop provided with a frequency discriminator, with the frequency-control loop being able to be switched off after the PLL has locked in, wherein:, with a predetermined change in frequency, the frequency of the YIG-tuned oscillator (1) is preset by a microprocessor (17) that changes the coil current ($I_{SP}$) of the primary tuning coil (13) of the YIG-tuned oscillator (1) stepwise in an iterative capture routine until the capture range (ΔFM) of the switched-on frequency-control loop, which is shifted with the coil current ($I_{SP}$) includes the new operating frequency ($f_{SOLL}$), whereupon the switched-on frequency-control loop pulls the oscillator frequency into the PLL capture range, and the PLL locks into the new operating frequency ($f_{SOLL}$); and the microprocessor (17) interrupts the capture routine if the PLL-LOCK detector (11) announces to the microprocessor (17) that the new operating frequency ($f_{SOLL}$) has been locked in.

2. The method according to claim 1, wherein: the capture routine starts with a coil current ($I_{SP}$) that ensures that the actual frequency (f) of the YIG-tuned oscillator (1) lies above the new operating frequency ($f_{SOLL}$), even with consideration of the maximum possible characteristic deviation due to aging and hysteresis; the microprocessor (17) reduces the coil current ($I_{SP}$) in uniform, adjacent steps until the capture range (ΔFM) of the frequency-control loop includes the new operating frequency ($f_{SOLL}$), and the actual frequency (f) locks into the new operating frequency ($f_{SOLL}$) due to the control loops within the clock duration (Δτ) of the capture routine; and the size of the frequency steps (ΔISP) effected by the coil-current steps is smaller than the capture range (ΔFM) of the frequency-control loop.

3. The method according to claim 1, wherein: the capture routine starts with a coil current ($I_{SP}$) that is associated with the new operating frequency ($f_{SOLL}$) according to the oscillator characteristic; in a deviation of the actual frequency as dictated by aging and hysteresis, the microprocessor (17) adjusts the coil current ($I_{SP}$) by one-fourth of a predetermined lock-in range (ΔF) for a subsequent, second iteration step, wherein, when a positive frequency deviation occurs, the initial coil current ($I_{SP}$) is reduced by this value, and when a negative frequency deviation occurs, the current is increased by this value; if a deviation continues in further iteration steps, the coil current ($I_{SP}$) is repeatedly increased or reduced by one-half of the preceding adjusted amount, depending on the operational sign of the deviation, as described above until the capture range (ΔFM) of the frequency-control loop includes the new operating frequency ($f_{SOLL}$).

4. The method according to claim 1, wherein: prior to a change in frequency, the microprocessor 17 has determined the offset of the actual frequency (f), as dictated by aging during a preceding frequency change, and has stored and taken into consideration this value in the present frequency change to the new operating frequency ($f_{SOLL}$) in the establishment of the starting value for the coil current ($I_{SP}$).

5. The method according to claim 1, wherein: directly following the completed capture routine, the microprocessor (17) initiates a tuning routine for the FM coil (14), during which, depending on the output signal of an FM-coil current monitor (19), which detects the coil current ($I_{FM}$) of the FM coil (14) and announces it to the microprocessor (17), the coil current ($I_{FM}$) of the FM coil (14) is controlled through an iterative adjustment of the coil current ($I_{SP}$) of the primary tuning coil (13) into a preferred working range ($\Delta AB$) whose associated frequency range, as the working-frequency range ($\Delta AB$), expands, thereby assuming a portion of the capture range ($\Delta FM$) of the frequency-control loop.

6. The method according to claim 5, wherein: the coil current ($I_{SP}$) of the primary tuning coil (13) is adjusted in uniform steps that effect uniform frequency steps ($\Delta ISP_A$); and the adjustment is effected with a clock duration ($\Delta\tau_A$) that is smaller than the clock duration ($\Delta\tau$) of the capture routine.

7. The method according to claim 1, wherein: following tuning of the YIG-tuned oscillator (1) to the new nominal frequency, an occurring drift of the YIG-tuned oscillator (1) is compensated by means of the FM coil (14) in that the microprocessor (17) controls the coil current ($I_{SP}$) of the primary tuning coil (13) as a function of the output signal of an FM-coil current monitor (19), which detects the coil current ($I_{FM}$) of the FM coil (14), such that the coil current ($I_{FM}$) of the FM coil (14), which has drifted out is once again in its working-frequency range ($\Delta AB$).

8. The method according to claim 1, wherin: in the first operation of the capture routine, the microprocessor (17) determines the offset, as dictated by aging and hysteresis, stores the offset and, upon the next start of the capture routine, takes it into consideration in the determination of the starting value for the coil current ($I_{SP}$) of the primary tuning coil (13).

9. An arrangement for executing the method according to claim 1, wherein:
- a predeterminable portion of the output signal of the YIG-tuned oscillator (1) is compared to a reference frequency by a coupling-out stage (2) in a frequency discriminator (10);
- the output signal ($\Delta f$) of the frequency discriminator (10) is supplied into the negative-feedback branch of a loop filter (9) embodied as an integrator, whose output current is used directly as a coil current ($I_{FM}$) for regulating the magnetic field of the FM coil (13) of the YIG-tuned oscillator (1);
- the coil current ($I_{SP}$) of the primary tuning coil (13) of the YIG-tuned oscillator (1) is generated by a V/I converter (12), which is controlled by a microprocessor (17) via a D/A converter; the output signal ($\Delta f$) of the frequency discriminator (10) is detected by a PLL-LOCK detector (11), which transmits its output signal ($U_D$) to the microprocessor (17); and
- an in-phase signal (sin) is coupled from a phase comparator (8) of the frequency discriminator (10), and is supplied to the input of the loop filter (9).

10. The arrangement according to claim 9, wherein: the output signal of the PLL-LOCK detector (11) is binary, and changes its state when the output signal ($\Delta f$) of the frequency discriminator (10) assumes the value "zero."

11. The arrangement according to claim 9, wherein: the PLL-LOCK detector (11) has two binary signal outputs that are coupled to one another and are complementary in assuming the LOW and HIGH states, and change these states when the output ($\Delta f$) of the frequency discriminator (10) changes its value from "greater than zero" to a value "less than zero."

12. The arrangement according to claim 9, wherein: the output signal ($U_{FM}$) of the loop filter (9) is monitored by an FM-coil current monitor (19), which has two binary signal outputs, one of which assumes the HIGH state when the value of the output signal ($U_{FM}$) of the loop filter (9) exceeds an upper limit value (+$U_{MAX}$), while the other output assumes the HIGH state when the value of the output ($U_{FM}$) of the loop filter (9) is less than a lower limit value (-$U_{MAX}$).

13. The arrangement according to claim 9, wherein: the YIG-tuned oscillator (1) is coupled to two quartz oscillators (5, 6), with one quartz oscillator (5) transmitting its frequency (f1) to a frequency mixer (3) by way of a settable frequency multiplier (4), where a beat-frequency signal (IF) is formed with the output signal of the YIG-tuned oscillator (1), the signal being transmitted, along with a reference frequency, to the inputs of the frequency discriminator (10); and this reference frequency is the output frequency (f2) of a settable direct digital synthesizer (7), which is fed by the other quartz oscillator (6).

14. The arrangement according to one of claim 9, wherein: the YIG-tuned oscillator (1) is only coupled to one quartz oscillator (6), whose frequency is transmitted to a settable frequency multiplier (4), and, following multiplication, is transmitted as a reference frequency to the frequency discriminator (10) for comparison with the output signal of the YIG-tuned oscillator (1).

15. The arrangement according to one of claim 9, wherein: the output signal ($\Delta f$) of the frequency discriminator (10) is separated from the negative-feedback branch of the loop filter (9) with an analog switch (16) when the PLL-LOCK detector (11) transmits a switching signal ($U_{SCH}$) to the analog switch following the locking in of the YIG-tuned oscillator (1) to a new operating frequency.

* * * * *